(12) United States Patent
Chan

(10) Patent No.: US 8,742,453 B2
(45) Date of Patent: Jun. 3, 2014

(54) HIGH LINEARITY HYBRID TRANSISTOR DEVICE

(75) Inventor: Richard T. Chan, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 537 days.

(21) Appl. No.: 13/211,541

(22) Filed: Aug. 17, 2011

(65) Prior Publication Data

US 2013/0043483 A1 Feb. 21, 2013

(51) Int. Cl.
*H01L 27/06* (2006.01)

(52) U.S. Cl.
USPC .................................. 257/140; 257/E27.015

(58) Field of Classification Search
None
See application file for complete search history.

(56) References Cited

U.S. PATENT DOCUMENTS

| | | | |
|---|---|---|---|
| 7,015,519 B2 | 3/2006 | Krutko et al. | |
| 7,718,486 B2 | 5/2010 | Krutko et al. | |
| 2010/0006944 A1* | 1/2010 | Chatty et al. | 257/362 |
| 2011/0121881 A1 | 5/2011 | Feng et al. | |

OTHER PUBLICATIONS

Enea et al. "The ESBT (Emitter-Switched Bipolar Transistor): a new monolithic power actuator technology devoted to high voltage and high frequency applications." 2007, IEEE, pp. 418-421.*
Tang et al. "Hybrid All-SiC MOS-Gated Bipolar Transistor (MGT)." 2002, IEEE, pp. 53-56.*
Ramanathan, et al., Commercial Viability of a Merged HBT-FET (BiFET) Technology for GaAs Power Amplifiers, CS Mantech Conference, May 14-17, 2007, Austin, TX, pp. 255-259.
US 7,977,708, 07/2011, Henderson et al. (withdrawn)

* cited by examiner

*Primary Examiner* — Wensing Kuo
(74) *Attorney, Agent, or Firm* — Finch & Maloney PLLC; Neil F. Maloney

(57) ABSTRACT

A hybrid transistor device is provided. In one example case, the device includes a substrate, an oxide layer formed on the substrate, and a wide-bandgap body material formed between a portion of the oxide layer and a gate dielectric layer. The wide-bandgap body material has an energy bandgap higher than that of silicon. The device includes source-drain/emitter material formed on the oxide layer adjacent to the wide-bandgap body material so as to define a hetero-structure interface where the source-drain/emitter material contacts the wide-bandgap body material. The device includes a gate material formed over the gate dielectric layer, a base material formed over a portion of the source-drain/emitter material, and a collector material formed over a portion of the base material. The source-drain/emitter material is shared so as to electrically combine a drain of a first transistor type portion of the device and an emitter of a second transistor type portion.

20 Claims, 11 Drawing Sheets

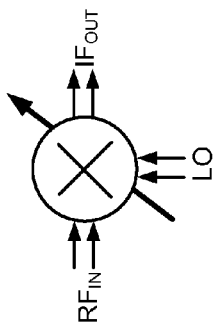
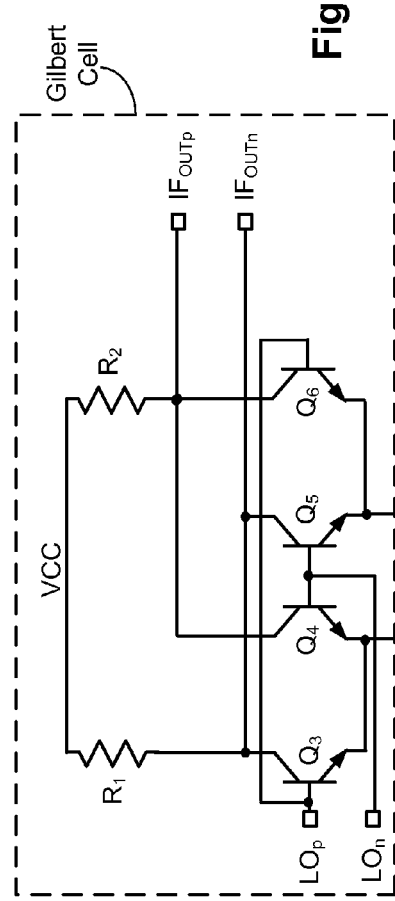
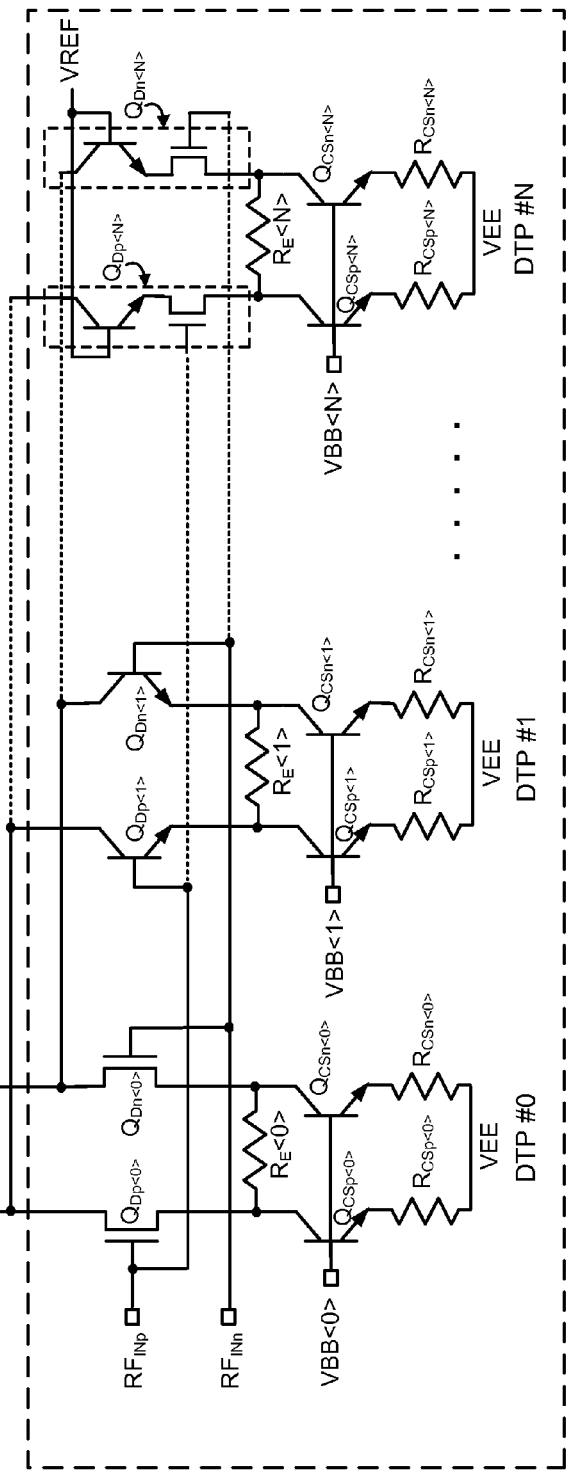
Fig. 4a
Fig. 4b

HIGH LINEARITY HYBRID TRANSISTOR DEVICE

FIELD OF THE DISCLOSURE

The invention relates to integrated circuitry, and more particularly, to a transistor structure that provides high input and output linearity over a broad frequency range.

BACKGROUND

Large dynamic range requirements for radio frequency (RF), microwave and millimeterwave analog and mixed-signal integrated circuit design continue to increase. Such increasing dynamic range requirements give rise to a number of non-trivial and not well-understood issues, such as those related to gain, bandwidth, linearity, and power handling capabilities.

SUMMARY

One embodiment of the present invention provides a hybrid transistor device. The device includes a substrate, an oxide layer formed on the substrate, and a wide-bandgap body material formed between a portion of the oxide layer and a gate dielectric layer. The wide-bandgap body material has an energy bandgap higher than that of silicon. The device further includes source-drain/emitter material formed on the oxide layer adjacent to the wide-bandgap body material so as to define a hetero-structure interface where the source-drain/emitter material contacts the wide-bandgap body material. The device further includes a gate material formed over the gate dielectric layer, a base material formed over a portion of the source-drain/emitter material, and a collector material formed over a portion of the base material. The source-drain/emitter material is shared so as to electrically combine a drain of a first transistor type portion of the device and an emitter of a second transistor type portion of the device. In one particular example case, the device further includes each of a source contact, a gate contact, a collector contact, and a base contact. In another particular case, the substrate is a silicon bulk substrate or a silicon-on-insulator (SOI) substrate, and the oxide layer is a silicon dioxide layer. In another particular case, the gate dielectric layer extends beyond the wide-bandgap body material, and the wide-bandgap body material is lattice matched to at least one of the substrate and the source-drain/emitter material. In another particular case, the wide-bandgap body material is p-type body material, and the source-drain material is n-type source-drain/emitter material. In another particular case, the wide-bandgap body material has an energy bandgap of 2.0 eV or higher. In another particular case, the wide-bandgap body material is lattice matched to silicon. In another particular case, the wide-bandgap body material has an energy bandgap of 2.0 eV or higher and is lattice matched to silicon. In another particular case, the wide-bandgap body material comprises aluminum phosphide, gallium phosphide, or gallium arsenide phosphide.

Another embodiment of the present invention provides a hybrid transistor device. In this example case, the device includes a silicon substrate and a silicon dioxide layer formed on the substrate. The device further includes a wide-bandgap body material formed between a portion of the oxide layer and a gate dielectric layer. The wide-bandgap body material has an energy bandgap of 1.35 eV or higher and is lattice matched to the substrate. The gate dielectric layer extends beyond the wide-bandgap body material. The device further includes source-drain/emitter material formed on the oxide layer adjacent to the wide-bandgap body material so as to define a hetero-structure interface where the source-drain material contacts the wide-bandgap body material. The wide-bandgap body material is also lattice matched to the source-drain material. The device includes a gate material formed over the gate dielectric layer, a base material formed over a portion of the source-drain/emitter material, and a collector material formed over a portion of the base material. The source-drain/emitter material is shared so as to electrically combine a drain of a field effect transistor (FET) portion of the device to an emitter of a bipolar junction transistor (BJT) portion of the device. In one such particular example case, the device further includes each of a source contact, a gate contact, a collector contact, and a base contact. In another particular case, the substrate is a silicon bulk substrate or a silicon-on-insulator (SOI) substrate, and the oxide layer is a silicon dioxide layer. In another particular case, the wide-bandgap body material is p-type body material, and the source-drain material is n-type source-drain material. In another particular case, the wide-bandgap body material has an energy bandgap of 2.0 eV or higher. In another particular case, the wide-bandgap body material has an energy bandgap of 2.0 eV or higher and is lattice matched to silicon. In another particular case, the wide-bandgap body material comprises aluminum phosphide, gallium phosphide, or gallium arsenide phosphide.

Another embodiment of the present invention provides an integrated circuit chip, comprising one or more of the hybrid transistors device as described herein. In one such example case, the substrate is a silicon bulk substrate or a silicon-on-insulator (SOI) substrate, and the oxide layer is a silicon dioxide layer, and the wide-bandgap body material has an energy bandgap of 2.0 eV or higher and is lattice matched to silicon. In another particular case, the integrated circuit chip includes 10,000 or more of the transistor devices. In another particular case, the integrated circuit chip is a mixer circuit (e.g., Gilbert mixer with a single gain stage having hybrid mode, or a plurality of selectable gain stages and capable of multi-mode operation such as FET-only, BJT-only, or hybrid modes).

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIGS. 3a-3l illustrate a method for fabricating a transistor structure, in accordance with an embodiment of the present invention.

FIGS. 4a-b illustrate a switched gain Gilbert cell mixer circuit implemented with a transistor structure configured in accordance with an embodiment of the present invention.

As will be appreciated, the figures are not drawn to any particular scale or intended to implicate any specific limitations. Rather, the figures are generally drawn to merely facilitate understanding to the example techniques and device structures described herein.

DETAILED DESCRIPTION

A hybrid transistor device is provided. In one example case, the device includes a substrate, an oxide layer formed on the substrate, and a wide-bandgap body material formed between a portion of the oxide layer and a gate dielectric layer. The wide-bandgap body material has an energy bandgap higher than that of silicon. The device includes source-drain/emitter material formed on the oxide layer adjacent to the wide-bandgap body material so as to define a heterostructure interface where the source-drain/emitter material contacts the wide-bandgap body material. The device includes a gate material formed over the gate dielectric layer, a base material formed over a portion of the source-drain/emitter material, and a collector material formed over a portion of the base material. The source-drain/emitter material is shared so as to electrically combine a drain of a first transistor type portion of the device and an emitter of a second transistor type portion.

General Overview

As previously explained, continue increasing of large dynamic range requirements for RF, microwave and millimeterwave analog and mixed-signal integrated circuit design give rise to a number of non-trivial and not well-understood issues, such as those related to gain, bandwidth, linearity, and power handling capabilities. In more detail, field-effect transistors (FETs) such as metal oxide semiconductor FETs (MOSFETs), junction gate FETs (J-FETs), p-type high electron mobility transistors (pHEMTs), as well as hetero-junction bipolar transistors (HBTs) are preferred device choices for RF, microwave and millimeterwave analog and mixed-signal integrated circuit design. However, due to the intrinsic operation limitation of each configuration, FETs are mostly used in low-gain and high input linearity stages, and HBTs are mostly used in high gain and high output linearity stages.

Figure 1:
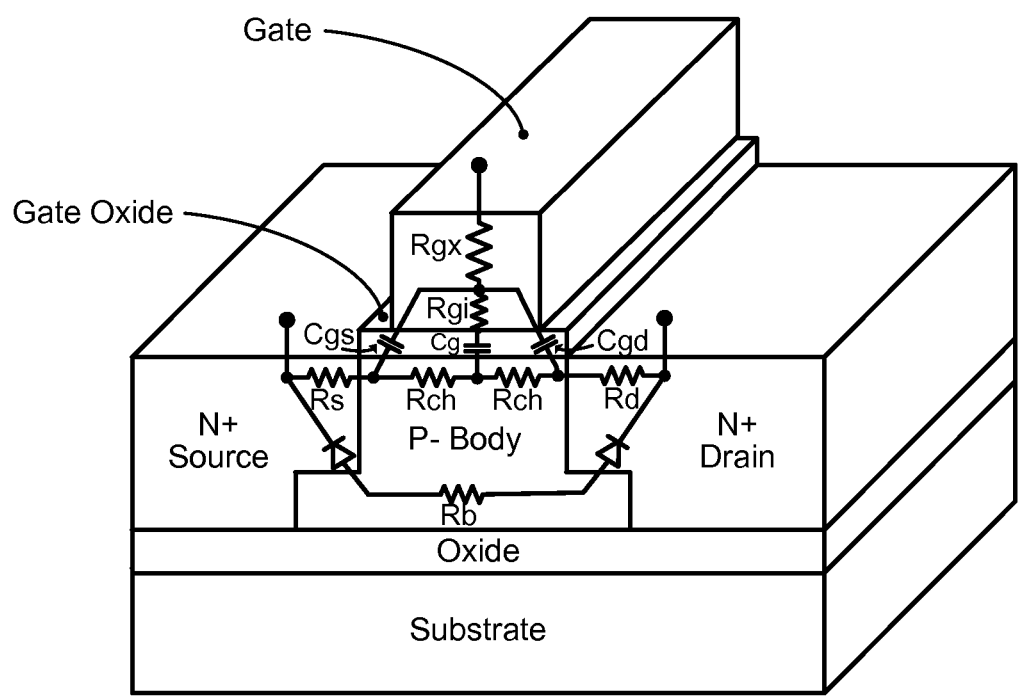
FIG. 1 illustrates a typical MOSFET structure and a number of linearity limitations associated therewith.

FIG. 1 schematically demonstrates example linearity limitations of conventional MOSFET technology. To achieve high transistor switching speed, MOSFET devices generally need a smaller gate length at the expense of breakdown performance. Large signal voltage-swing is a necessary condition to achieve high linearity and the transistor's signal swing breakdown voltage is set by gate-to-drain/drain dielectric breakdown field and source-to-drain barrier leakage. The necessary large signal voltage-swing, however, is not a sufficient condition for high dynamic range applications. As can be seen with the schematic overlay of FIG. 1, a conventional MOSFET structure includes a bias dependent poly-depletion resistance (Rgi), a non-linear junction capacitance (Cgd) at large drain/source-body bias voltages, and non-linear gate capacitances (Cg) during each of accumulation-depletion-inversion. In addition, a MOSFET structure's high output conductance Rch (i.e., 1/gd, where gd is the output conductance) at small gate length is undesirable. Thus, a number of longstanding linearity performance challenges remain in MOSFET technology, including nonlinear transconductance/conductance, the ability to maintain fast switching speed with improved breakdown characteristics (e.g., small gate length+ wider bandgap), minimizing short channel effect, and reducing switching time aberrations (e.g., threshold voltage $V_t$ variations).

A transistor device configured in accordance with an embodiment of the present invention is capable of simultaneously having both high input and high output linearity performance over a broad frequency spectrum (e.g., from a few GHz to hundreds of GHz). Such transistor devices can thus be used, for example, to implement circuitry having wideband and/or large dynamic range requirements, such as system-on-chip configurations (e.g., detectors and transceivers). One example embodiment provides a hybrid transistor device that effectively combines the advantages of both a FET structure (high input linearity) and an HBT structure (output linearity). In one such specific embodiment, the FET structure is configured with an inversion layer channel with dielectric. The HBT and FET portion of the hybrid device are electrically combined, as they share the drain/emitter material (rather than employing isolation structures for each FET and HBT). In some cases, the hybrid device can be configured as a four terminal device (source, gate, base, and collector) so as to achieve better isolation and output conductance of the switch, without requiring a separate device. The combined high linearity of a MOSFET with HBT allows for wide-bandwidth power handling.

Given this simultaneous high input and high output linear performance of the hybrid device over a wide bandwidth, circuitry incorporating such devices has significantly higher dynamic range. The hybrid devices of some such embodiments can be further configured to provide significantly higher bandwidth and power handling capability, relative to bipolar junction transistor complementary metal oxide semiconductor (sometimes referred to as BiCMOS) transistors or heterostructure integration of compound semiconductor on silicon substrate. The device can also be configured to provide simultaneous high speed switching and high linearity, and allows for a high level of integration for numerous applications, such as large dynamic range transceivers or other such communication devices (e.g., surveillance receivers).

Conventional technologies such as BiCMOS (which generally implements separate HBT and MOSFET structures on the same silicon platform with isolation structures for each of the MOSFET and HBT devices) and heterogeneous integration of HBT and CMOS devices using flip-chip compound semiconductor on silicon are problematic, for example, with respect to interconnect parasitics reduce device operation bandwidth and switching speed (due to combined cascode FET/HBT arrangement). In contrast, an embodiment of the present invention can be configured to enable RF signal handling capability at high speed switching by utilizing FET-like input linearity and HBT-like output linearity with minimal parasitic capacitance and resistance. In some such embodiments, and as will be appreciated in light of this disclosure, such a device can also be configured to exhibit an excellent input/output intercept point, simultaneous transconductance and output conductance, and FET phase noise reduction with HBT (or any desired bi-polar junction transistor, BJT) incorporation. Numerous hybrid configurations and combinations of benefits can be realized.

Hybrid HBT/FET Device

Figure 2A:
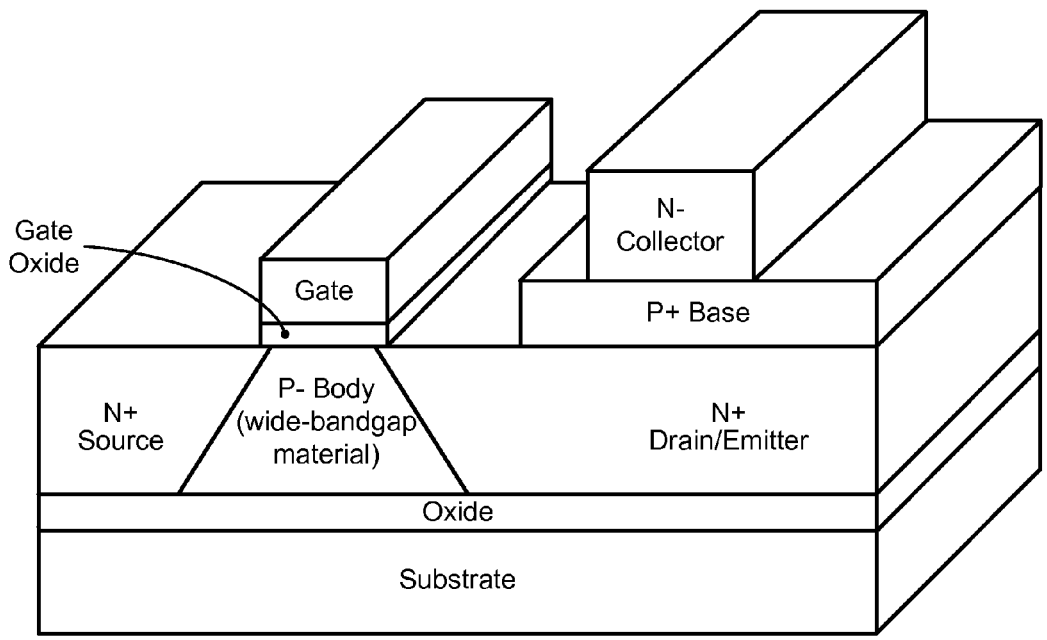
FIGS. 2a-b illustrate a transistor structure configured in accordance with an embodiment of the present invention.

FIG. 2*a* illustrates perspective cross-sectional view of a transistor structure configured in accordance with an embodiment of the present invention. As can be seen, the example transistor structure is a high linearity hybrid HBT-FET device that includes a CMOS heterojunction N-channel FET portion and a CMOS HBT portion configured with an N-type emitter, P-type base and N-type collector, although other device constructions will be apparent in light of this disclosure, and the claimed invention is not intended to be limited to any particular configuration. For example, any configuration having an NPN bi-polar transistor implemented on top of the FET device and configured to provide better switch isolation from the input to the output can be used (i.e., HBT is not necessary, and any bi-polar transistor structure can be used).

The FET portion of this example embodiment is configured with a wide-bandgap body material that is lattice matched to the source-drain/emitter material and allows for simultaneous fast switching and large signal power handling capability. In accordance with an specific such embodiment, a wide-bandgap compound semiconductor material that is lattice matched to silicon (or other desired source-drain material) and has high intrinsic electron mobility can be used. As an example, each of aluminum phosphide (AlP) or gallium phosphide (GaP) or Indium Phosphide (InP) or gallium arsenide phosphide (GaAsP) materials has a large breakdown voltage as well as good electron mobility and can be used to implement the wide-band gap p-body material for the example FET portion of the hybrid structure shown in FIG. 2a.

One of the advantages of using a hetero-structure interface of source-drain/emitter to body as shown in FIG. 2a is that it significantly improves the short-channel tunneling leakage (short-channel effects for source-drain/emitter) with the heterojunction barrier. In some example such embodiments, either bulk silicon or silicon-on-insulator (SOI) substrates can be used for implementation. A SOI substrate may be particularly useful to reduce body leakage through the silicon substrate (due to body to substrate conductance). Numerous other suitable substrate materials and configurations can be used as well, and the claimed invention is not intended to be limited to any one substrate material or set of materials or any particular substrate type.

The wide-bandgap p-body material improves source-drain breakdown performance relative to conventional structures. In some embodiments, for instance, materials have an energy bandgap of $Eg_x \gg Eg_{Si}$ are used for the wide-bandgap p-body material, wherein power handling associated with $Eg_x$ materials is improved at least one order of magnitude (or better) relative to power handling associated with $Eg_{Si}$. The wide-bandgap material can be provided using standard epitaxial growth and etch processes and can be implemented with materials such as lattice matched AlP ($Eg_x$=2.45 eV), GaP ($Eg_x$=2.27 eV), or GaAsP ($Eg_x$=2.26 eV). Other suitable materials having a bandgap in the range of 1.35 eV to 6.4 eV (or higher) that can lattice match to the substrate and source-drain/emitter materials can also be used.

With respect to the BJT portion of the structure (which in this example embodiment is an HBT as previously explained), the emitter is shared with the drain of the FET portion, which can be, for example, doped silicon. In one such example embodiment, the base and collector can also be implemented with silicon, so as to provide an energy bandgap of 1.1 eV. Alternatively, the base and collector can be implemented with wide-band p-body material (such as AlP, GaP or GaAsP) that is lattice matched to the drain/emitter material. In other embodiments, the base material can be implemented, for example, with strain material having a smaller bandgap such as silicon germanium (SiGe). Any number of BJT configurations can be used in accordance with an embodiment of the present invention, where the drain/emitter material is shared so as to the electrically combine the FET and BJT structures.

Figure 2B:
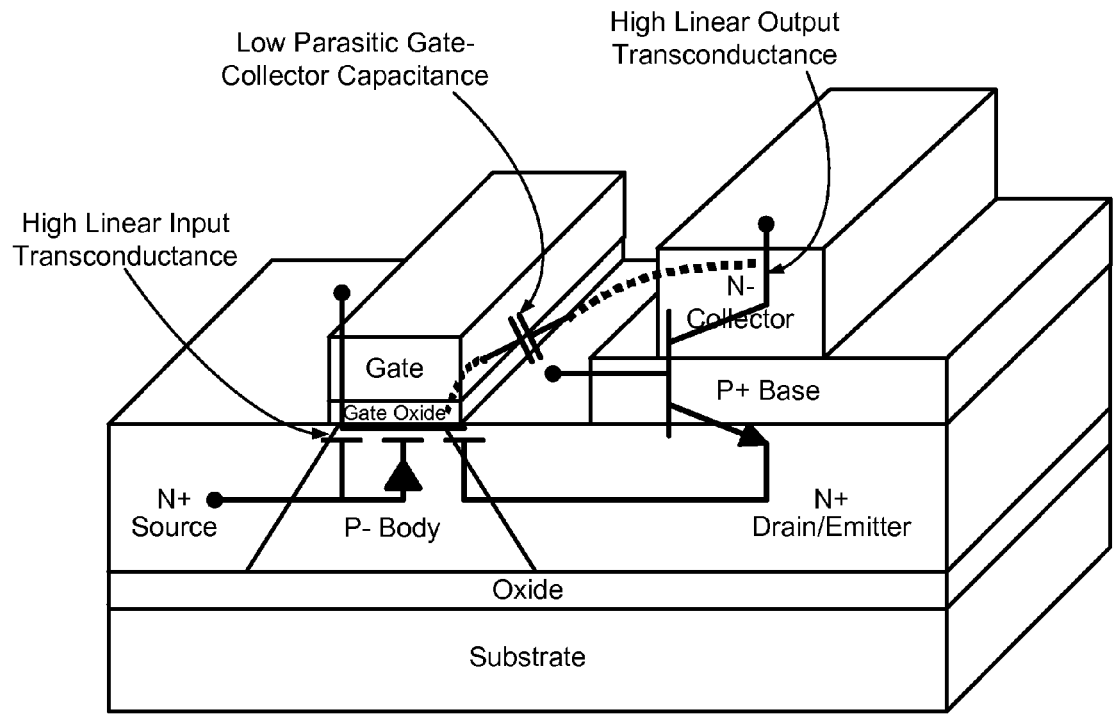

FIG. 2b schematically demonstrates linearity improvements of the example embodiment shown in FIG. 2a, relative to conventional MOSFET technology. To achieve high transistor switching speed, MOSFET devices generally need a smaller gate length at the expense of breakdown performance. Large signal voltage-swing is a necessary condition to achieve high linearity and the transistor's signal swing breakdown voltage is set by gate-to-drain/drain dielectric breakdown field and source-to-drain barrier leakage. The necessary large signal voltage-swing, however, is not a sufficient condition for high dynamic range applications.

As can be seen with the schematic overlay of FIG. 2b, a hybrid transistor structure configured in accordance with an embodiment of the present invention addresses such issues. For instance, the FET portion of the hybrid structure provides high linear input transconductance (which improves the $3^{rd}$ order input intercept point, or IIP3), and the HBT portion of the hybrid structure provides high linear output conductance (which improves the $3^{rd}$ order output intercept point, or OIP3). In addition, the hybrid structure allows for low undesirable non-linear feedback capacitance from the gate to collector. Assuming, for example, a silicon substrate with a silicon dioxide layer thereon, doped silicon source and drain/emitter material, and a wide-bandgap material having a bandgap of 2.0 eV or higher that is lattice matched to silicon, any number of desirable performance criteria can be met, such as: switching speed $F_T$, $F_{max}$>200 GHz; flat $F_T$, $F_{max}$ slope vs. Jc (near peak performance); voltage swing>4V; low threshold voltage Vth variation; spurious-free dynamic range (SFDR)>135 dBc-Hz$^{2/3}$; and device integration>2000 transistors/mm$^2$. Such example performance criteria are not intended to limit the claimed invention, but are merely provided as an example set.

Fabrication Methodology

FIGS. 3a-3l illustrate a method for fabricating a transistor structure, in accordance with an embodiment of the present invention. In this example case, the resulting structure is a high linearity hybrid HBT-FET device that includes a CMOS heterojunction N-channel FET portion and a CMOS HBT portion configured with an N-type emitter, P-type base and N-type collector, although other device constructions will be apparent in light of this disclosure, and the claimed invention is not intended to be limited to any particular configuration. For example, any configuration having an NPN bi-polar transistor implemented on top of the FET device and configured to provide better switch isolation from the input to the output can be used (i.e., HBT is not necessary, any bi-polar transistor structure can be used).

Figure 3A:
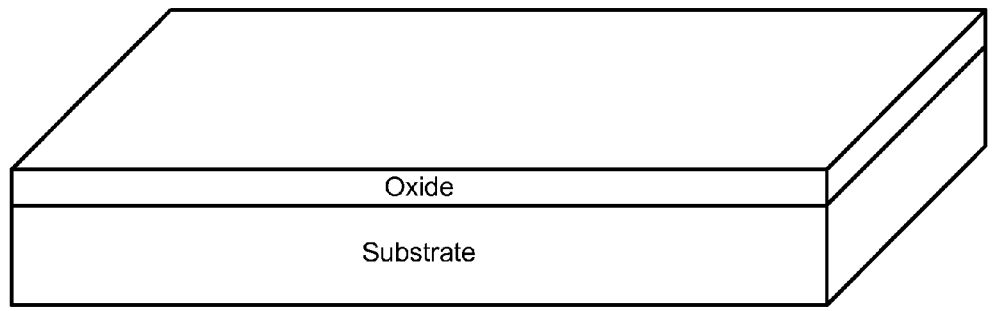

The method begins with depositing a thin oxide layer on top of the substrate, as shown in FIG. 3a. The oxide layer acts as a non-conductive device isolation layer, and can be grown or otherwise deposited using any standard crystal growth methods such as liquid phase epitaxy (LPE), molecular beam epitaxy (MBE), metal-organic chemical vapor deposition (MOCVD), or oxidation of silicon substrate. As previously explained, the substrate can be, for example, a bulk X substrate or X-on-insulator (XOI) substrate (e.g., X=silicon, silicon germanium, gallium arsenide, or other suitable substrate material). In one specific example embodiment, the substrate is a standard bulk silicon or SOI substrate and the oxide layer is silicon dioxide (SiO$_2$). Other oxide layer materials can be used, depending on the substrate material (e.g., native oxide layer or any oxide material layer that works with the overall material system).

Figure 3B:
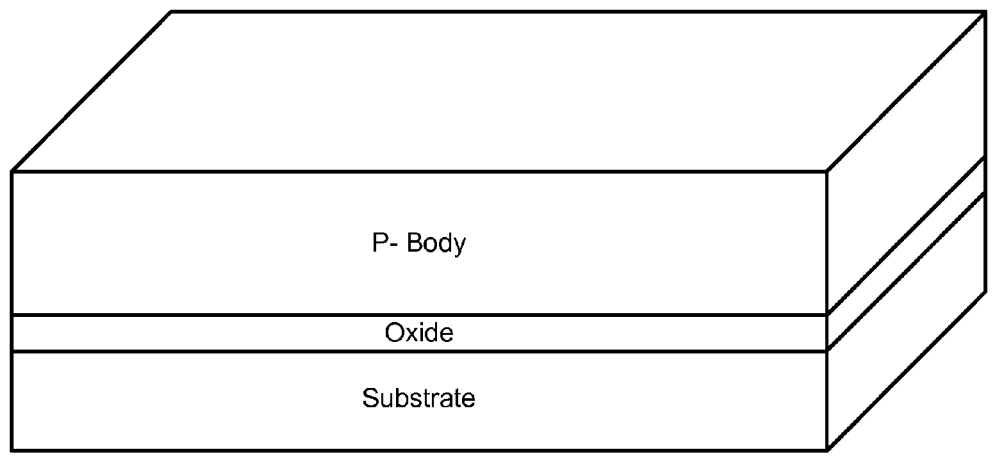

The method of this example embodiment continues with depositing a wide-bandgap, lightly doped p-type body material on the oxide layer, as shown in FIG. 3b. The wide-bandgap can be deposited, for example, using LPE, MBE, or MOCVD processes to form the CMOS channel. Continuing with the specific example embodiment having a Si substrate and a $SiO_2$ layer, the wide-bandgap p-body material can be AlP, GaP, and GaAsP, or other suitable material having an Eg sufficiently greater than the Eg of Silicon (by one order of magnitude, or higher), such as an Eg of 1.35 eV or higher. The thickness of each of the substrate, oxide, and p-body layers can vary, as will be appreciated in light of this disclosure, and conventional layer thickness ranges are generally fine for many applications.

Figure 3C:
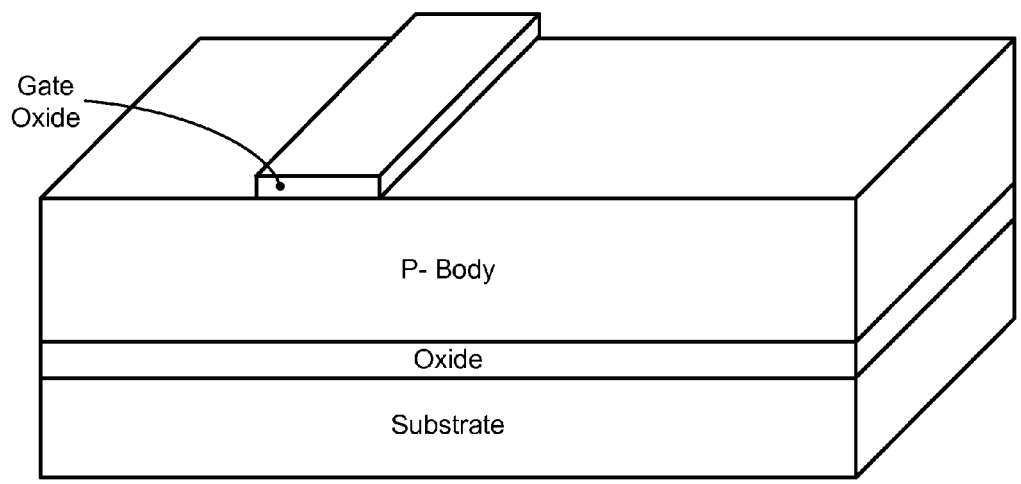

The method continues with depositing and patterning a thin layer of dielectric material on top of p-type material layer, as shown in FIG. 3c. This layer provides the gate oxide, and can be implemented with standard lithography to form desired gate geometry. Continuing with the specific example embodiment having a Si substrate and a $SiO_2$ layer, the gate oxide can be a grown dielectric layer of $SiO_2$ or high-k material (depending on factors such as the desired degree of gate insulation and the gate oxide layer thickness). Example high-k materials include, for instance, hafnium silicate, hafnium dioxide, zirconium dioxide, and zirconium silicate, which can be deposited using atomic layer deposition as typically done.

Figure 3D:
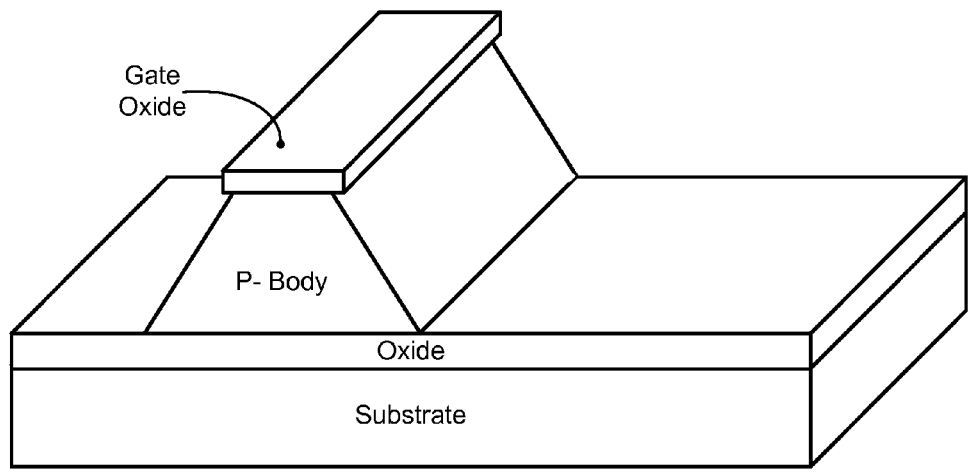

After the gate dielectric/oxide formation, the method continues with etching away the excess wide-bandgap body material using, for example, either a wet-chemical etching or dry plasma etching process, or a combination of wet and dry etching, while using the gate dielectric material as an etching mask, as shown in FIG. 3d. As can be further seen in FIG. 3d, extra material etching (undercut) underneath the gate dielectric material is allows for source-drain/emitter material overlap with the gate dielectric. In this particular case, the undercut allows an N-channel inversion layer between the source and the drain/emitter even if the gate is biased above threshold voltage, Vth. The electron conduction channel is induced with the positive gate biased voltage. Thus, the p-body is slightly smaller than gate dielectric to have electrical conductivity during device operation. The angled aspect of the walls of the remaining body material shown in this example embodiment is due to the crystal plane and etching for compound semiconductor material. In other embodiments, however, the walls may be straight. In general, if the body etching process uses a wet chemical, an angled profile will result. If the body etching process uses a dry plasma such as reactive ion etching (RIE) or inductively coupled plasma etching (ICP), a straight profile will result.

Figure 3E:
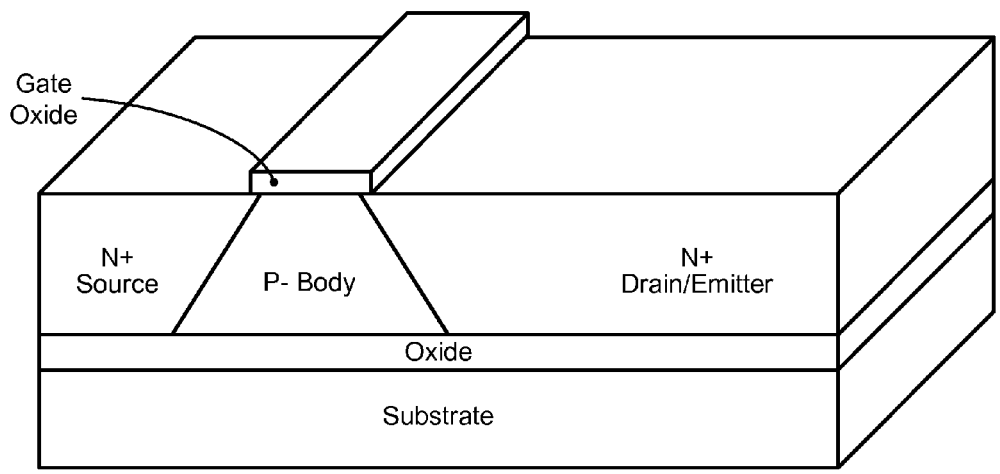

Once the excess wide-bandgap body material has been etched away, the method of this example embodiment continues with depositing the source and drain/emitter material using, for example, any suitable epitaxial growth methods (e.g., LPE, MOCVD and/or MBE) to create the n-type source and drain/emitter region (drain is for FET portion and emitter is for HBT portion), as shown in FIG. 3e. The source and drain/emitter regions can be doped during the crystal growth process. Epitaxial growth methods such as LPE, MOCVD and MBE can be used to both deposit the lattice matched source-drain/emitter material, and add desired N+ doping level using doping elements such as phosphorus and arsenic in the silicon lattice (e.g., dopants can be incorporated during source/drain crystal growth process). A doping activation process can be carried out after the source-drain/emitter material deposition at an elevated temperature (e.g., ion-implantation and annealing) to achieve desired doping level. Additional mask layers and processing may be used as necessary. Continuing with the specific example embodiment having a silicon substrate and an $SiO_2$ layer, the source and drain material can be, for instance, silicon doped with phosphorus or arsenic. Other suitable material systems and dopant schemes will be apparent in light of this disclosure.

Figure 3F:
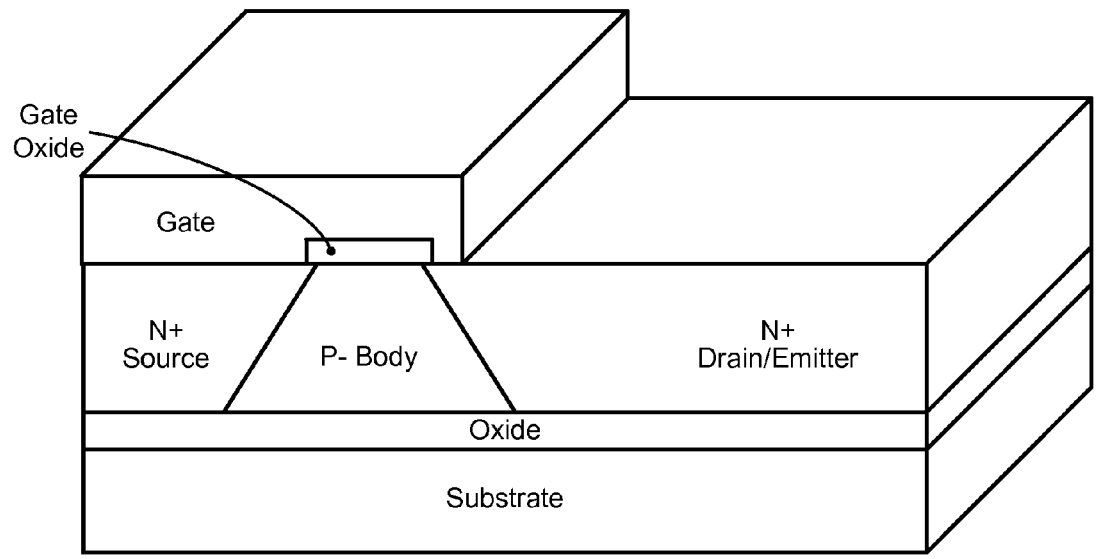

The method of this example embodiment continues with deposition of the gate material (e.g., using, for instance, chemical vapor deposition or a sputtering process) and patterning an opening for the HBT region regrowth process, as shown in FIG. 3f. The gate material can be, for instance, poly-silicon or other suitably conductive gate material. In some example embodiments, a combination of wet and dry etch processes can be used to remove excess gate material over the HBT area, so as to provide desired planarity of the surface on which to form the HBT base materials. In a more general sense, surface roughness can be reduced using standard processing techniques (such as combination wet/dry etches) as necessary throughout the methodology, to prepare for subsequent processing.

Figure 3G:
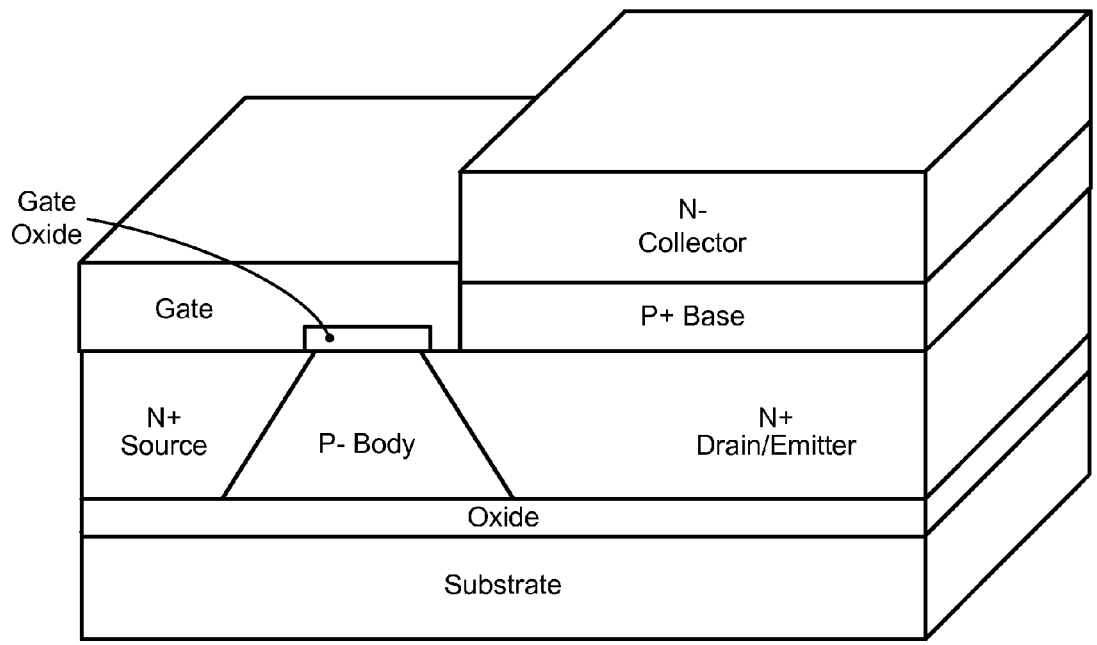

The method continues with depositing the base and collector material of the HBT using the gate material as a growth mask, as shown in FIG. 3g. In some such embodiments, a high temperature crystal growth process can be used to form the base and collector of the HBT structure. In such cases, the gate material needs to withstand or otherwise be compatible with the high temperature crystal growth process. In some specific such cases, a temporary layer of $SiO_2$ or similar dielectric material can be deposited over gate material such as highly doped poly-silicon, to mask the subsequent base and collector material growth on top of the gate region. The base and collector of the HBT can be deposited using, for example, LPE, MOCVD or MBE, while the $SiO_2$ protects the FET (CMOS) device region, where the minimal surface exposure allows for optimum FET device performance to be achieved. The temporary $SiO_2$ layer can then be removed. As previously explained, each of the source, drain/emitter, base and collector materials can be implemented with silicon, so as to provide an energy bandgap of 1.1 eV. Alternatively, the base and collector can be implemented with wide-band p-body materials such as AlP, GaP, GaAsP, or other such high-bandgap material that is lattice matched to the drain/emitter material. In other embodiments, the base material can be implemented, for example, with strain material having a smaller bandgap such as silicon germanium (SiGe). If applicable, a hetero junction material grading interface can be used between different base and collector materials, to facilitate energy bandgap transition.

Figure 3H:
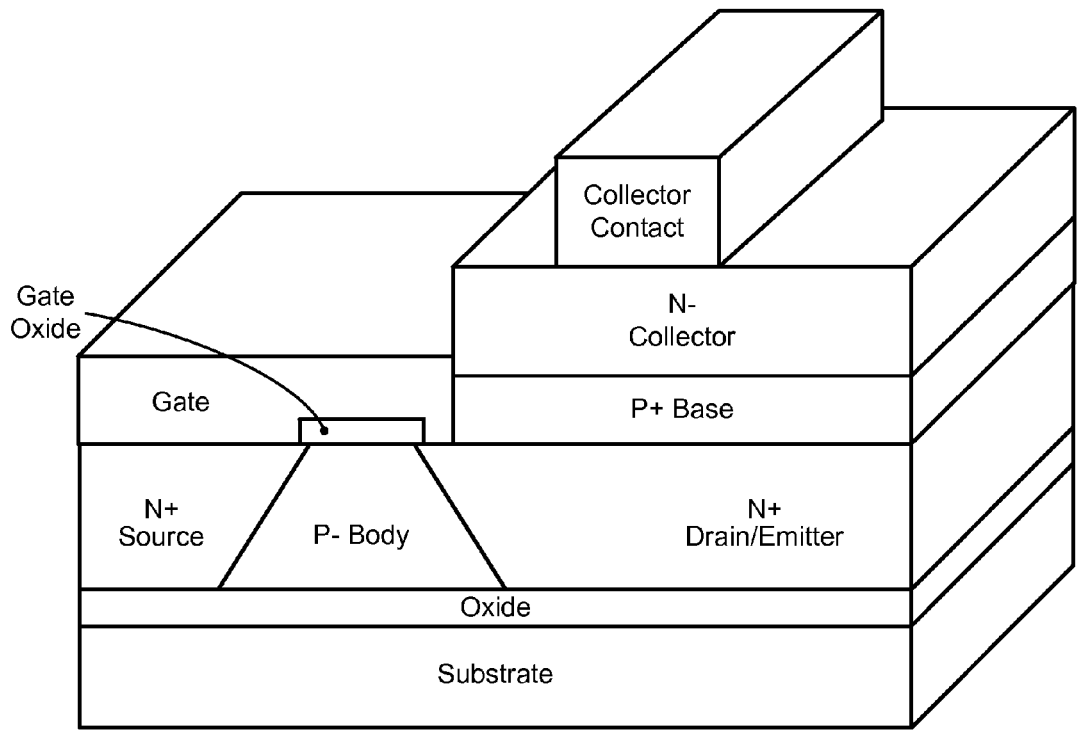
Figure 3I:
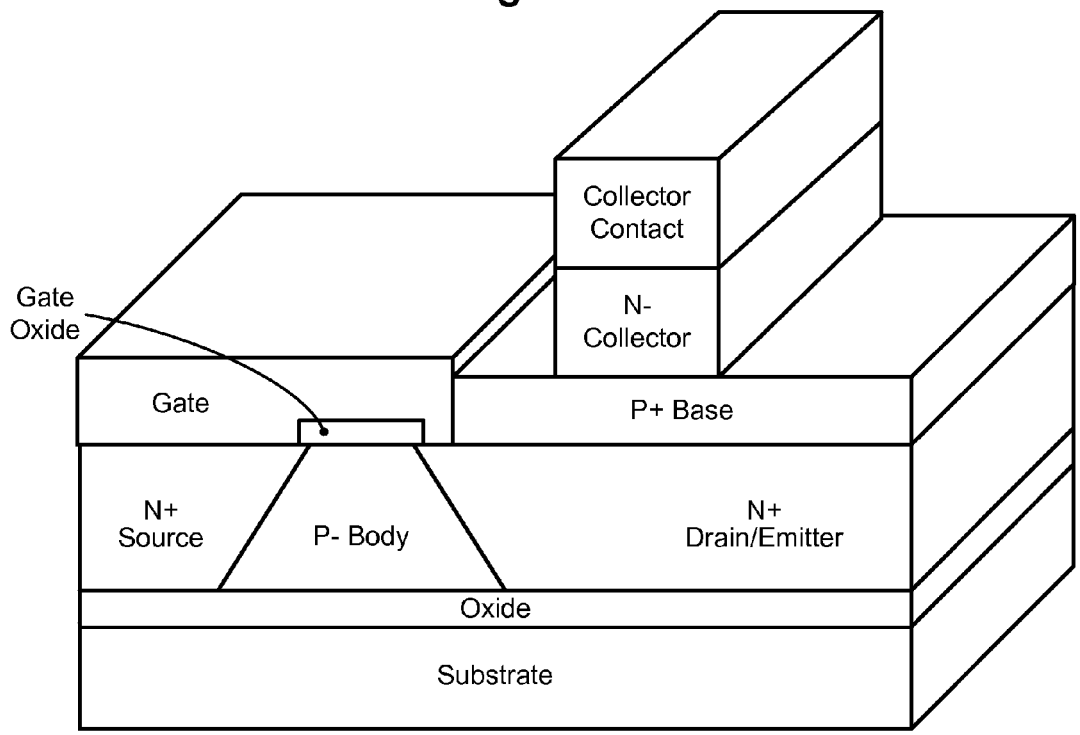
Figure 3J:
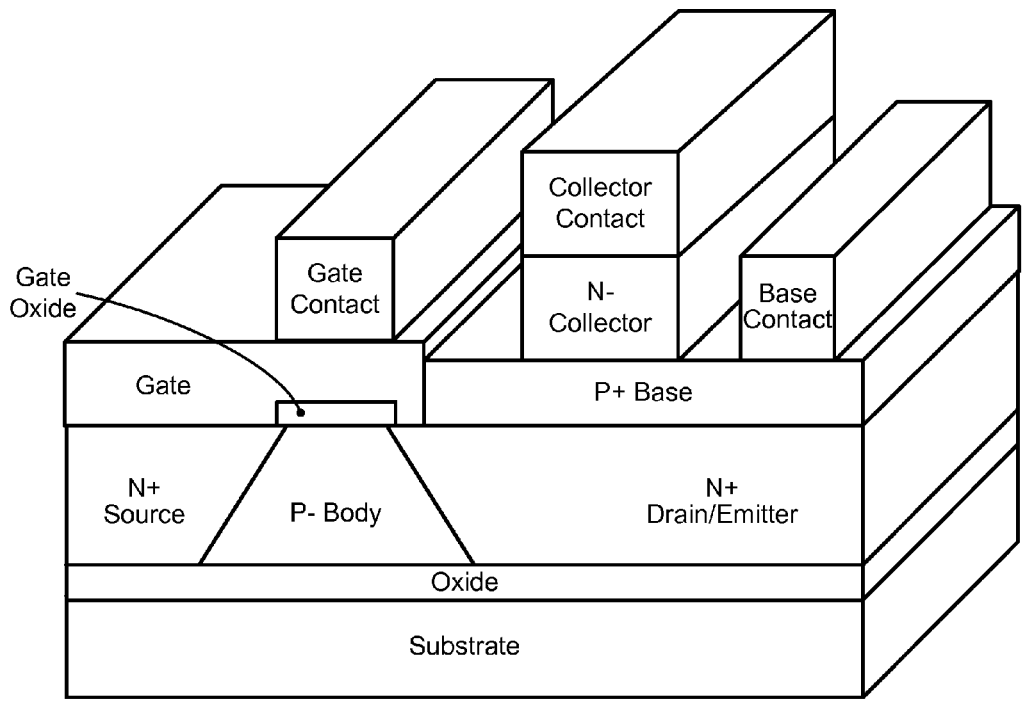

After collector material deposition, the method continues with depositing the collector ohmic metal contact material, as shown in FIG. 3h, and then etching the excess collector material using the collector ohmic metal contact material as an etch mask as shown in FIG. 3i. Either a wet-chemical etching process or dry plasma etching process, or a combination of wet and dry etching can be used. The base material can effectively be used as an etch stop. The method then continues with deposition of gate and base ohmic contact material, as shown in FIG. 3j. The ohmic metal gate, collector and base contacts form the device interconnect between the semiconductor gate, collector and base materials to the metal contacts/pads using standard interconnect fabrication processes (e.g., CVD or sputtering of ohmic contact material with post-metallization annealing step). The ohmic contact material can be any number of suitable materials, depending on the structure configuration. For example, a gold-germanium-nickel (Au—Ge—Ni) alloy can be used for n-type ohmic contact to III-V compound semiconductor materials, and a titanium-platinum-gold (Ti—Pt—Au) or palladium-platinum-gold (Pd—Pt—Au) alloy can be used for p-type III-V compound semiconductor materials. For silicon, titanium-aluminum (Ti—Al) can be used for ohmic contact material, or any number of silicides (e.g., silicide of aluminum, nickel, platinum, titanium, and/or tungsten). Ohmic materials are generally used as a low resistance transition layer between semiconductor to metal interface and it is typically a very thin layer. Typically, the ohmic metal is deposited first and then annealed to form the low resistance interface to semiconductor before the contact/pad metal is deposited. The contact/pad metal can be, for instance, aluminum or copper or silver or gold or other suitable metal contact material.

Figure 3K:
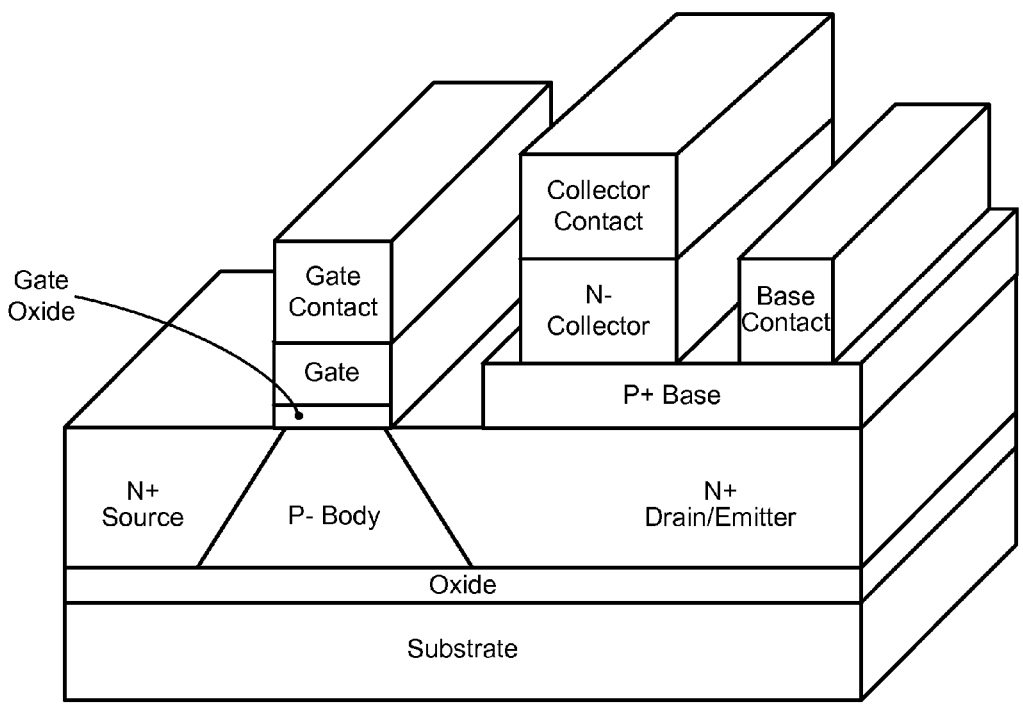
Figure 3I:
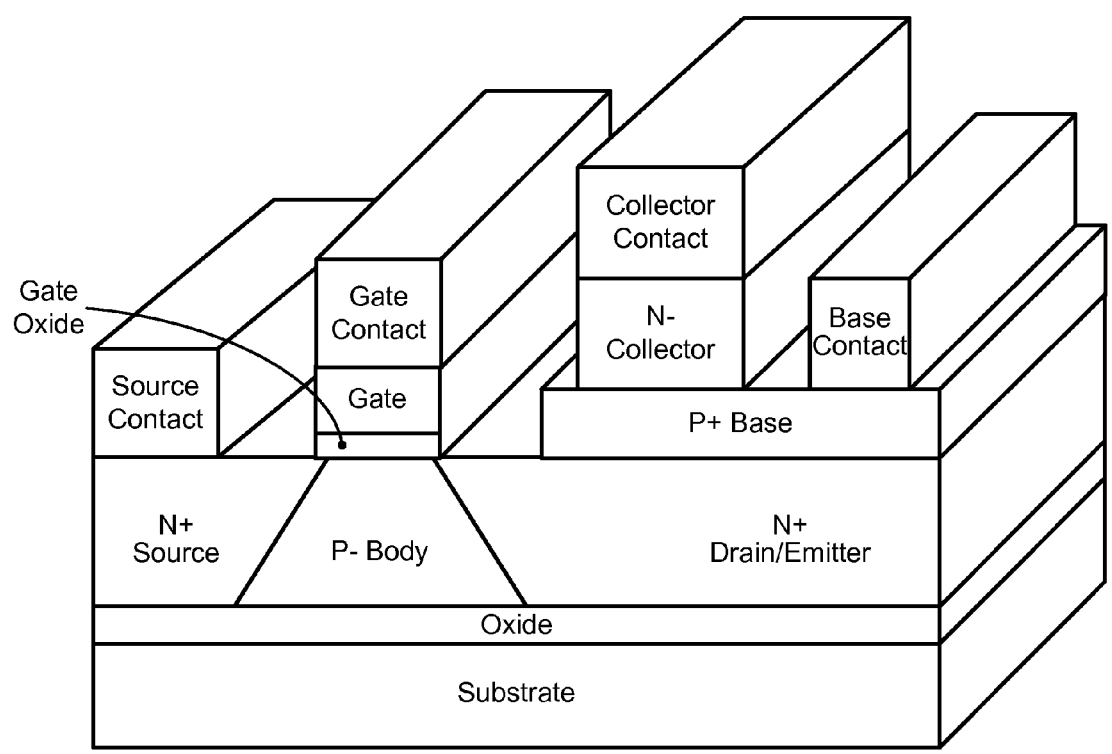

After formation of the gate and base contacts, the method continues with etching any excess gate material on top of the source and drain/emitter regions (and any remaining excess collector material, if any) using the contact metal deposits as an etch mask, as shown in FIG. 3k. In one example case, the excess gate material can be removed using a combination of wet and dry etching. One the excess gate material has been removed, the method continues with depositing the source ohmic metal contact material as shown in FIG. 3l, which can be the same of the other ohmic metal contact materials deposited for the gate, collector, and base contacts.

Switched-Gain Gilbert Cell Mixer Architecture with Hybrid Mode

FIGS. 4a-b illustrate a switched gain Gilbert cell mixer circuit implemented with a hybrid transistor structure configured in accordance with an embodiment of the present invention. As can be seen with reference to FIG. 4a, the mixer circuit receives a single differential input signal ($RF_{IN}$), which is to be mixed with a differential local oscillator signal (LO) to provide a differential output signal $IF_{OUT}$). In addition, the mixer circuit can provide a variable gain, generally designated in FIG. 4a as a slanted arrow running through the mixer.

As can be seen in FIG. 4b, the mixer stage is implemented with a Gilbert cell, and the gain stage is implemented with N+1 RF gain stages (generally designated as DTP #0, DTP #1, ..., DTP #N), each configured with stage select circuitry thereby providing an integrated single-input Gilbert cell mixer circuit capable of providing multiple gain states. The adjustable gain state function is achieved without any performance degradation in linearity and noise figure typically associated with cascading a gain stage before or after the mixer circuit as conventionally done.

The gain stage of this example embodiment includes three operation modes: FET-only mode for high IIP3 and low gain (where DTP#0 is selected), HBT-only mode for high gain and low IIP3 (where DTP#1 is selected), and hybrid mode for high IIP3 and high gain and high LO/RF isolation (where DTP#N is selected). An advantage of the hybrid mode is that is employs a hybrid transistor structure as discussed herein and can thus provide, for instance, high isolation between gate to drain to achieve desired reverse isolation for the relevant RF port. Another advantage includes low interconnect parasitic to improve the operation bandwidth compared to standard cascode arrangements, as previously explained.

With further reference to FIG. 4b, the differential inputs of each gain stage are tied together to form a single differential input ($RF_{INp}$ and $RF_{INn}$), and the outputs of each gain stage are connected together and are cascaded by the single four-quadrant multiplier circuit (i.e., the Gilbert cell, in this example case). In this example embodiment, each differential pair is biased using two current sources (one for the p-differential signal and the other for the n-differential signal). Other embodiments can be implemented with a one tail current source, where degeneration impedance $R_E<n>$ is split into two serially connected resistors, which can have the same value. The current sources can be implemented, for example, as current mirrors with emitter degeneration, although other suitable current source configurations can be used as well. As will be appreciated in light of this disclosure, these differential current source pairs effectively provide a selection mechanism, thereby allowing multiple gain stages of the mixer circuit to be individually selected for amplifying (or attenuating) the RF input signal.

The RF gain stage DTP #1 is configured to operate during the HBT-only mode and includes a differential transconductance pair of HBTs, $Q_{Dp<1>}$ and $Q_{Dn<1>}$, and is configured to receive a differential input voltage designated as $RF_{INp}$ and $RF_{INn}$. When this gain stage DTP #1 is selected, this transistor pair $Q_{Dp<1>}$ and $Q_{Dn<1>}$ converts the differential input voltage at its bases to an output current at its collectors. In operation, the differential pair $Q_{Dp<1>}$ and $Q_{Dn<1>}$ is turned on (effectively selecting that gain stage) by raising or otherwise adjusting VBB<1> up to a proper voltage. When VBB<1> is applied, the combination of transistor $Q_{CSp<1>}$ and resistor $R_{CSp<1>}$ as well as transistor $Q_{CSn<1>}$ and resistor $R_{CSn<1>}$ sources a current that biases $Q_{Dp<1>}$ and $Q_{Dn<1>}$ into the linear active region. As will be appreciated, VBB<1> can be adjusted to achieve a desired gain within that active region. If VBB<1> is too low, then the RF gain stage DTP #1 will turn off; if VBB<1> is too high, then the RF gain stage DTP #1 will saturate; thus, the active region is between these two extremes. The gain of RF gain stage DTP #1 may also be adjusted, for example, by adjusting the degeneration impedance, $R_E<1>$.

The RF gain stage DTP #0 is configured similarly to gain stage DTP#1, except that the differential pair $Q_{Dp<0>}$ and $Q_{Dn<0>}$, of DTP #0 is implemented with a CMOS differential pair of FETs, as opposed to an HBT differential pair like $Q_{Dp<1>}$ and $Q_{Dn<1>}$. Thus, DTP #0 is configured to operate during the FET-only mode, and receives the same differential input voltage as received by gain stage DTP #1 (i.e., $RF_{INp}$ and $RF_{INn}$). In general, using CMOS FETs instead of, for example, HBTs for the differential transconductance pairs ($Q_{Dp<n>}$ and $Q_{Dn<n>}$) allows for higher output intercept points and noise figures to be achieved when high-gain isn't required. When gain stage DTP #0 is selected (FET-only mode), this transistor pair $Q_{Dp<0>}$ and $Q_{Dn<0>}$ converts the differential input voltage at its gates to an output current at its sources. In operation, the differential pair $Q_{Dp<0>}$ and $Q_{Dn<0>}$ is turned on (effectively selecting that gain stage) by raising or otherwise adjusting VBB<0> up to a proper voltage. When VBB<0> is applied, the combination of transistor $Q_{CSp<0>}$ and resistor $R_{CSp<0>}$ as well as transistor $Q_{CSn<0>}$ and resistor $R_{CSn<0>}$ sources a current that biases $Q_{Dp<0>}$ and $Q_{Dn<0>}$ into the linear active region. As will be appreciated, VBB<0> can be adjusted to achieve a desired gain within that active region. If VBB<0> is too low, then the RF gain stage DTP #0 will turn off; if VBB<0> is too high, then the RF gain stage DTP #0 will saturate; thus, the active region is between these two extremes. The gain of RF gain stage DTP #1 may also be adjusted, for example, by adjusting the degeneration impedance, $R_E<0>$.

The RF gain stage DTP #N is configured to operate during the hybrid mode and includes a differential transconductance pair of hybrid FET-HBT transistors, $Q_{Dp<N>}$ and $Q_{Dn<N>}$ (as described herein), and is configured to receive the same differential input voltage as received by gain stages DTP #0 and DTP #1 (i.e., $RF_{INp}$ and $RF_{INn}$). When gain stage DTP #N is selected, this hybrid transistor pair $Q_{Dp<N>}$ and $Q_{Dn<N>}$ converts the differential input voltage at its gates to an output current at its collectors. In operation, the differential pair $Q_{Dp<N>}$ and $Q_{Dn<N>}$ is turned on (effectively selecting that gain stage) by raising or otherwise adjusting VBB<N> up to a proper voltage. When VBB<N> is applied, the combination of transistor $Q_{CSp<N>}$ and resistor $R_{CSp<N>}$ as well as transistor $Q_{CSn<N>}$ and resistor $R_{CSn<N>}$ sources a current that biases $Q_{Dp<N>}$ and $Q_{Dn<N>}$ into the linear active region. In addition, $V_{REF}$ is applied to the bases of $Q_{Dp<n>}$ and $Q_{Dn<N>}$, so as to provide a suitable bias for the HBT portion of the structure for high linearity operation as well as excellent LO port to RF port high frequency isolation. As will be appreciated, VBB<N> can be adjusted to achieve a desired gain within that active region. If VBB<N> is too low, then the RF gain stage DTP #N will turn off; if VBB<N> is too high, then the RF gain stage DTP #N will saturate; thus, the active region is between these two extremes. The gain of RF gain stage DTP #N may also be adjusted, for example, by adjusting the degeneration impedance, $R_E$<N>.

An advantage in summing the outputs of the differential transconductance pairs ($Q_{Dp<n>}$ and $Q_{Dn<n>}$), whether via collectors of heterojunction bipolar transistors $Q_{Dp<1>}$ and $Q_{Dn<1>}$ (such as shown in DTP#1) or the drains of CMOS transistors $Q_{Dp<0>}$ and $Q_{Dn<0>}$ (such as shown in DTP#0) or the collectors of hybrid FET-HBT transistors $Q_{Dp<N>}$ and $Q_{Dn<N>}$ (such as shown in DTP#N), is that low impedance current switching (rather than voltage switching) allows multiple inputs to be combined into a single node with little or no significant intermodulation product or noise figure degradation. Such a configuration gives the flexibility to reduce layout parasitics for simultaneous high speed, wideband, and high dynamic range applications, in accordance with an embodiment of the present invention. Note that only one of each gain stage mode type is shown in the example of FIG. 4b, but any number of the differential transconductance pairs ($Q_{Dp<n>}$ and $Q_{Dn<n>}$, where n can be any integer from 0 to N) can be implemented with CMOS, BJT/HBT, or hybrid process technology.

Thus, and in accordance with some embodiments, such a multi-gain stage multi-mode mixer circuit operation allows for only one at a time of the differential transconductance pair of transistors $Q_{Dp<n>}$ and $Q_{Dn<n>}$ to be biased on (e.g., somewhere in the linear or otherwise active region of the differential pair) to enable a desired mode of operation, by applying the appropriate voltage VBB<n> to the corresponding selection circuitry (to the base terminals of transistors $Q_{CSp<n>}$ and $Q_{CSn<n>}$, in this example), VBB<n>. The gain of RF gain stage DTP #n can be adjusted by adjusting VBB<n> within the linear or otherwise active region of the differential pair, and may also be adjusted, for example, by adjusting the degeneration impedance, $R_E$<n>. Note that n can be any integer from 0 to N, and represents one of N+1 RF gain stages. In accordance with one example embodiment, each of the differential pairs is configured with a different small-signal transconductance (to provide a different gain), and the overall gain of the switched-gain Gilbert cell mixer is determined by which differential pair is biased on. In other embodiments, two or more of the gain stages can be switched into operation, which may or may not be a mixed-mode operation (e.g., such as selecting both DTP#0 and DTP#N, to provide a mixed mode of FET-only mode and hybrid mode).

As will be appreciated in light of this disclosure, gain adjustments can be made in a number of ways, including adjusting the emitter degeneration resistance and/or the transistor device sizes within each differential pair and/or by biasing a differential pair in the active region at a time. Any one or combination of these can be used to provide a mixer with variable gain control.

Allowing for low impedance current switching (as opposed to voltage switching) allows multiple inputs to be combined into a single node with little or no significant intermodulation product or noise figure degradation. For instance, in one example embodiment, providing multi-gain stage functionality incurs a 10% (or lower) increase in intermodulation product (linearity) or noise figure degradation, relative to conventional single gain stage configurations.

Figure 5A:
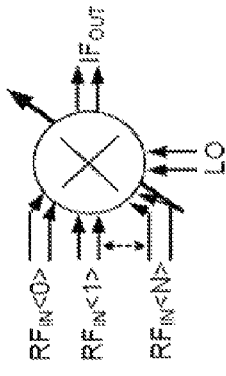
FIGS. 5a-b illustrate a switched gain Gilbert cell mixer circuit implemented with a transistor structure configured in accordance with another embodiment of the present invention.
Figure 5B:
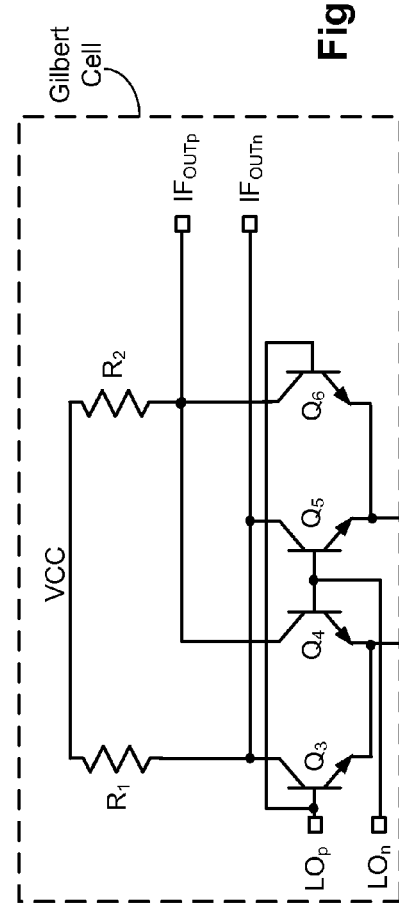
Figure 5B:
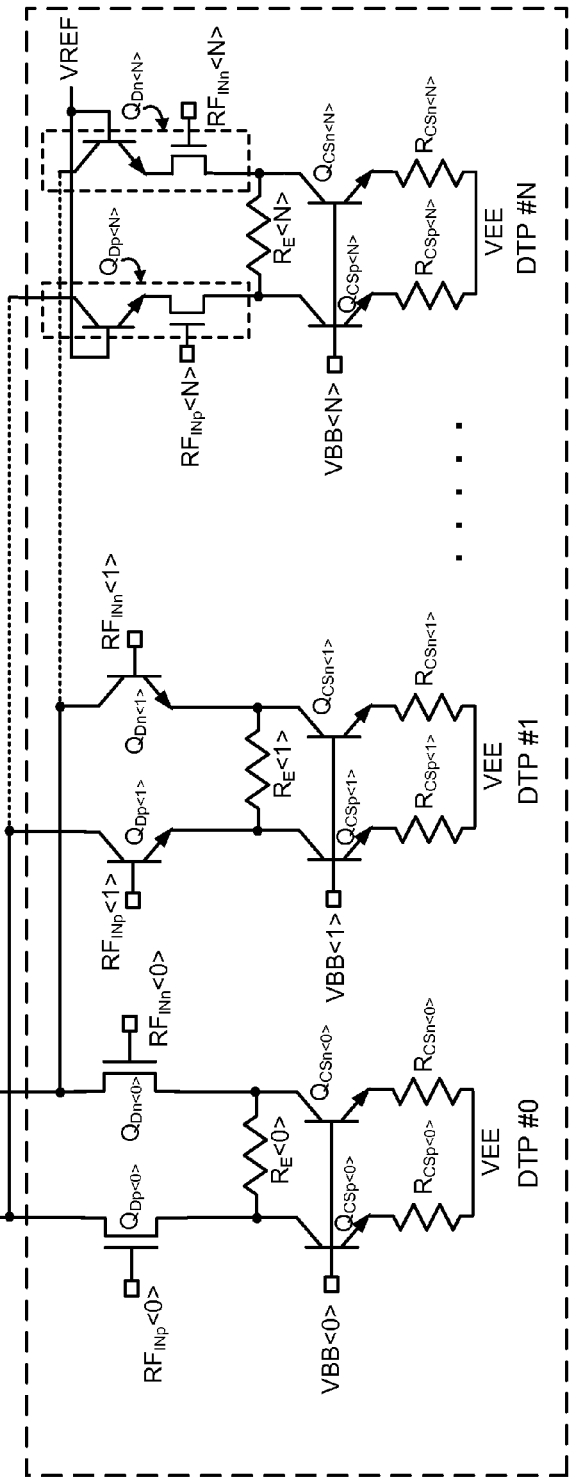

FIGS. 5a-b illustrate a switched gain Gilbert cell mixer circuit implemented with a hybrid transistor structure configured in accordance with another embodiment of the present invention. As can be seen, this configuration is similar to that shown in FIGS. 4a-b, except that each gain stage in this embodiment receives a different differential input signal, $RF_{INp<n>}$ and $RF_{INn<n>}$. The previous relevant discussion with reference to FIGS. 4a-b equally applies here.

System

Figure 6:
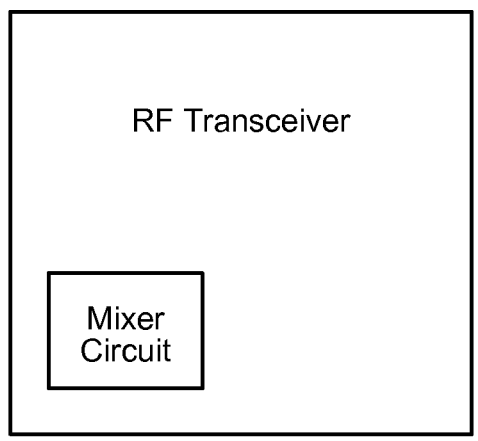
FIG. 6 is an SoC integrated circuit implemented with transistors configured in accordance with an embodiment of the present invention.

FIG. 6 is an SoC integrated circuit implemented with transistors configured in accordance with an embodiment of the present invention. In this example case, the SoC is configured for a transceiver application, but any number of other SoC applications can be implemented, as will be appreciated. The claimed invention is not intended to be limited to any particular SoC application.

As is known, a transceiver is configured with both a transmitter and a receiver that share common circuitry in a single housing (such as a transceiver on a chip). They are typically used in any number of communication applications (e.g., modems, radios, etc). In any case, the transceiver of this example embodiment includes a mixer circuit. In such applications, the mixer is generally used to convert the RF transmission band to IF band in receive direction, or from the IF band to the RF transmission band in the transmit direction. In one example configuration, the mixer circuit includes a Gilbert cell mixer stage and a plurality of input/gain stages implemented with differential pairs. Each input/gain stage has its output connected to the input of the mixer stage (e.g., cascode connected), and is configured to receive an input signal and apply a gain factor (e.g., to provide unity gain, amplification, and/or attenuation) to that input signal to provide a signal for mixing with the LO. Each of the Gilbert cell mixer stage and the input/gain stages can be implemented with transistors as described herein. This will allow the transceiver SoC to simultaneously operate with a high degree of linearity, fast switching speeds, and large signal power handling capability, as will be appreciated in light of this disclosure.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A hybrid transistor device, comprising:
   a substrate;
   an oxide layer formed on the substrate;
   a wide-bandgap body material formed between a portion of the oxide layer and a gate dielectric layer, the wide-bandgap body material having an energy bandgap higher than that of silicon;
   source-drain/emitter material formed on the oxide layer adjacent to the wide-bandgap body material so as to define a hetero-structure interface where the source-drain/emitter material contacts the wide-bandgap body material;
   a gate material formed over the gate dielectric layer;
   a base material formed over a portion of the source-drain/emitter material; and a collector material formed over a portion of the base material;

wherein the source-drain/emitter material is shared so as to electrically combine a drain of a first transistor type portion of the device and an emitter of a second transistor type portion of the device.

2. The device of claim 1, further comprising each of a source contact, a gate contact, a collector contact, and a base contact.

3. The device of claim 1 wherein the substrate is a silicon bulk substrate or a silicon-on-insulator (SOI) substrate, and the oxide layer is a silicon dioxide layer.

4. The device of claim 1 wherein the gate dielectric layer extends beyond the wide-bandgap body material, and the wide-bandgap body material is lattice matched to at least one of the substrate and the source-drain/emitter material.

5. The device of claim 1 wherein the wide-bandgap body material is p-type body material, and the source-drain material is n-type source-drain/emitter material.

6. The device of claim 1 wherein the wide-bandgap body material has an energy bandgap of 2.0 eV or higher.

7. The device of claim 1 wherein the wide-bandgap body material is lattice matched to silicon.

8. The device of claim 1 wherein the wide-bandgap body material has an energy bandgap of 2.0 eV or higher and is lattice matched to silicon.

9. The device of claim 1 wherein the wide-bandgap body material comprises aluminum phosphide, gallium phosphide, or gallium arsenide phosphide.

10. A hybrid transistor device, comprising:
a silicon substrate;
a silicon dioxide layer formed on the substrate;
a wide-bandgap body material formed between a portion of the oxide layer and a gate dielectric layer, the wide-bandgap body material having an energy bandgap of 1.35 eV or higher and being lattice matched to the substrate, wherein the gate dielectric layer extends beyond the wide-bandgap body material;
source-drain/emitter material formed on the oxide layer adjacent to the wide-bandgap body material so as to define a hetero-structure interface where the source-drain material contacts the wide-bandgap body material, the wide-bandgap body material also being lattice matched to the source-drain material;
a gate material formed over the gate dielectric layer;
a base material formed over a portion of the source-drain/emitter material; and
a collector material formed over a portion of the base material;

wherein the source-drain/emitter material is shared so as to electrically combine a drain of a field effect transistor (FET) portion of the device to an emitter of a bipolar junction transistor (BJT) portion of the device.

11. The device of claim 10, further comprising each of a source contact, a gate contact, a collector contact, and a base contact.

12. The device of claim 10 wherein the substrate is a silicon bulk substrate or a silicon-on-insulator (SOI) substrate, and the oxide layer is a silicon dioxide layer.

13. The device of claim 10 wherein the wide-bandgap body material is p-type body material, and the source-drain material is n-type source-drain material.

14. The device of claim 10 wherein the wide-bandgap body material has an energy bandgap of 2.0 eV or higher.

15. The device of claim 10 wherein the wide-bandgap body material has an energy bandgap of 2.0 eV or higher and is lattice matched to silicon.

16. The device of claim 10 wherein the wide-bandgap body material comprises aluminum phosphide, gallium phosphide, or gallium arsenide phosphide.

17. An integrated circuit chip, comprising at least one of the hybrid transistor devices of claim 10.

18. The integrated circuit chip of claim 17 wherein the substrate is a silicon bulk substrate or a silicon-on-insulator (SOI) substrate, and the oxide layer is a silicon dioxide layer, and the wide-bandgap body material has an energy bandgap of 2.0 eV or higher and is lattice matched to silicon.

19. The integrated circuit chip of claim 17 wherein the integrated circuit chip includes 10,000 or more of the hybrid transistor devices.

20. The integrated circuit chip of claim 17 wherein the integrated circuit chip is a mixer circuit.

* * * * *